United States Patent [19]
Thomas et al.

[11] Patent Number: 4,880,698
[45] Date of Patent: Nov. 14, 1989

[54] COATED FLAT GLASS

[75] Inventors: Jean-François Thomas, Ottignies; Robert Terneu, Thiméon; Albert Van Cauter, Charleroi; Robert Van Laethem, Loverval-Gerpinnes, all of Belgium

[73] Assignee: Glaverbel, Brussels, Belgium

[21] Appl. No.: 930,758

[22] Filed: Nov. 14, 1986

[30] Foreign Application Priority Data

Dec. 20, 1985 [GB] United Kingdom ............. 8531423
Dec. 20, 1985 [GB] United Kingdom ............. 8531424
Dec. 20, 1985 [GB] United Kingdom ............. 8531425

[51] Int. Cl.$^4$ .................... B32B 17/06; B05D 5/06
[52] U.S. Cl. .................................... 428/333; 428/432; 428/689; 428/702; 428/908.8; 428/913; 427/126.2; 427/126.3; 427/165; 427/166; 427/168
[58] Field of Search ............... 428/105, 220, 702, 323, 428/908.81, 432, 328, 332, 333, 336, 913, 689, 119; 427/168, 226, 126.1, 126.2, 166, 126.3, 255.2, 165, 255

[56] References Cited

U.S. PATENT DOCUMENTS

| | | | |
|---|---|---|---|
| 3,510,343 | 5/1970 | Twells | 428/432 |
| 3,850,665 | 11/1974 | Plumat et al. | 428/432 |
| 3,984,591 | 10/1976 | Plumat et al. | 427/165 |
| 4,006,070 | 2/1977 | King et al. | 428/432 |
| 4,125,391 | 11/1978 | Laethem | 427/168 |
| 4,265,974 | 5/1981 | Gordon | 428/432 |
| 4,293,326 | 10/1981 | Ternea | 427/166 |
| 4,322,477 | 3/1982 | Wahlers et al. | 428/432 |
| 4,330,318 | 5/1982 | Cauter et al. | 427/168 |
| 4,349,369 | 9/1982 | Laethem et al. | 427/168 |
| 4,349,370 | 9/1982 | Terneu | 427/168 |
| 4,349,371 | 9/1982 | Laethem et al. | 427/168 |
| 4,349,372 | 9/1982 | Laethem et al. | 427/168 |
| 4,548,836 | 10/1985 | Middleton et al. | 427/160 |
| 4,584,236 | 4/1986 | Colmon et al. | 428/432 |

Primary Examiner—Ellis P. Robinson
Assistant Examiner—Donald J. Loney
Attorney, Agent, or Firm—Spencer & Frank

[57] ABSTRACT

Flat glass is disclosed, bearing a tin oxide coating layer which is at least 200 nm in thickness. In order to promote a uniform visual appearance across the coated area, the expected grain area of a representative sample of the tin oxide coating crystals measured in units of $10^{-4}$ $\mu m^2$ is numerically equal to a value of at least 0.4 times the layer thickness measured in nanometers.

20 Claims, 4 Drawing Sheets

COATED FLAT GLASS

BACKGROUND OF THE INVENTION

1. Field of the Invention

This invention relates to flat glass bearing a tin oxide coating layer.

2. Description of the Related Art

As is well known, tin oxide coatings often comprise an optional doping agent in order to render the coating electrically conductive, and they may also include minor proportions of other compatible materials for various purposes. The nature and amount of any atoms present other than tin and oxygen should not exceed a limit above which the crystal lattice structure type of the coating differs from that of cassiterite.

Glass sheets bearing a conductive tin oxide coating are widely used inter alia for glazing purposes because of the ability of the tin oxide coating to reduce the emissivity of the coated sheet face in respect of infra-red radiation, especially for wavelengths greater than 3 $\mu$m.

It is desirable that a coated sheet used for glazing purposes should be of uniform appearance over its area.

In practice, such coated sheets often exhibit differences in appearance from one region to another. There are various known causes of such variations, including for example variations in coating thickness which may give rise to varying colours over the area of the coating due to interference effects, and variations in coating characteristics giving rise to haze.

Appearance contrasts still occur even when care is taken to make the coating thickness as uniform as possible and to maintain constant conditions during formation of the tin oxide coating.

It has hitherto been considered advantageous, in order to obtain uniform optical properties, that the coating must essentially consist of small crystals. In order to promote the formation of small crystals during pyrolytic deposition of a tin oxide coating layer, it is known to form the tin oxide coating layer from the vapour phase on a thin still-hot preformed coating layer of titanium dioxide which has a similar crystallographic structure to that of tin oxide. The thin titanium dioxide subbing layer tends to be formed of a large number of very small crystals, and thus provides a large number of closely spaced seed points for the growth of a large number of very small tin oxide crystals.

SUMMARY OF THE INVENTION

The present invention is based on the surprising discovery that the avoidance or reduction of visual contrast effects can in fact best be promoted by forming the tin oxide coating with large crystals.

According to the invention, there is provided flat glass bearing a tin oxide coating layer, characterised in that such tin oxide layer is at least 200 nm thick and in that the expected grain area of a representative sample of the tin oxide coating crystals measured in units of $10^{-4}$ $\mu$m$^2$ is numerically equal to a value of at least 0.4 times the layer thickness measured in nanometers.

A tin oxide coating is built up from crystals which tend to grow more or less perpendicular to the surface of the glass (whether they grow from the glass surface itself or from crystals already formed on the glass) to achieve the required coating thickness. This appearance is readily recognisable from electron-micrographs taken of the coated surface. A measurement of the relative areas of the coating crystals can accordingly be obtained from an electron-micrograph taken in plan view in which the outlines of the individual crystals are readily visible. Even if the coating has been polished so as to eliminate any rugosity, and thus to render the crystal outlines indistinct, the crystal outlines can readily be redeveloped by an etching technique. It is convenient to take the area occupied on such a micrograph by a crystal as an indication of the crystal size in terms of its grain area.

In order to determine the grain areas of a representative sample of crystals, we adopt the following procedure. An electron-micrograph to a scale of 100,000 times is made, in plan view, of each of a number of randomly selected sites over the area of the coated sheet. The outline of each crystal in a randomly selected group of 750 crystals shown on these micrographs is traced using a plotter connected to a data processor programmed to derive crystal area $X_i$ for each crystal (i) from the data from the plotter. Various computations are then carried out in order to analyse the size distribution within the crystal population. For this purpose, the potential range of crystal areas is divided up into intervals of $50\times10^{-4}$ $\mu$m$^2$, and the crystals falling within each interval are counted.

DEFINITIONS

The expected grain area, sometimes also known as the mean, is given by the expression Expected grain area =

$$\frac{\text{Sum of all individual grain areas}}{\text{Number of crystals}} \text{ or } \mu_1 = \frac{\text{SUM}[X_i]}{n}$$

The standard deviation is given by the expression
Standard deviation squared $$(\sigma^2) = \frac{\text{SUM}[X_i - \mu_1]^2}{n-1}$$

The third central moment is given by the expression
Third central moment $$(\mu_3) = \frac{\text{SUM}[X_i - \mu_1]^3}{n}$$

The coefficient of skewness is given by the expression
Coefficient of skewness $(\eta) = \mu_3/\sigma^3$ We have found that the high expected grain area in the coating crystals of coated sheet glass according to this invention is highly correlated with a low visual contrast, and the product is thus of more acceptable visual appearance. This is in marked contrast to previous theories relating to optical tin oxide coatings. In fact we have found that given a high expected grain area as above specified, the ratio between the expected grain areas of different samples tends to be closer to unity, and that this is associated with low contrast.

We have briefly referred to the problem of haze varying over the coated sheet area. It is often desirable to have a low absolute level of diffuse light transmission, and this has been the subject of much research in the past. Haze, the visible aspect of diffuse light transmission, has been attributed to three main causes. Defects at the glass-coating interface, sometimes caused by reactions between the glass and the tin oxide of the coating; defects within the thickness of the coating and attributable to its structure; and defects at the surface of the coating. Defects at the glass-coating interface can be alleviated by proper choice of coating process, by making use of a subbing layer, and/or by using dealkalised glass. Surface defects can be alleviated by proper choice of coating process, or they can be removed by polishing the coating. Defects within the thickness of the coating can only be alleviated by proper choice of coating process, since they depend on the physical structure of the coating layer. Suitable processes for achieving coating layers having an internal structure which is favourable for a low absolute diffuse light transmission are described and claimed in British Patent Application Nos. 85 31 423, 85 31 424 and 85 31 425.

It has previously been thought that it is desirable to have a coating made up from crystals having a uniform grain area. We have found that low haze levels are achieved, in a product according to this invention, not so much when the crystal population has a uniform grain area, as when there is a particular distribution of grain areas in the total crystal population. In preferred embodiments of the invention, when a population density curve is established by plotting the number of crystals of a representative sample of the tin oxide crystals having a grain area within a given interval on the ordinate, and grain area on the abscissa, that curve has a positive coefficient of skewness, and preferable a skewness coefficient of at least 1. The grain area interval which we adopt for this purpose is $50 \times 10^{-4}$ $\mu m^2$. We have found that such distributions of grain areas are well correlated with a low absolute diffuse light transmission, and thus with a low level of haze.

Another problem which arises in relation to coated glass is in relation to ageing of the product. The coating in particular should be able to withstand the conditions to which it will be subjected during the course of it life. For example the coating should have sufficient mechanical resistance and adherence to resist abrasion during cleaning. We have found that the mechanical resistance of a tin oxide coating is promoted if the population density curve has a positive coefficient of skewness as referred to above, and there is a wide variation in the sizes of the crystals which make up the coating. In preferred embodiments of the invention therefore, the positive skewness factor is combined with the feature that the standard deviation of the grain area of a representative sample of the tin oxide coating crystals is at least half the expected value, and preferably it is at least 0.7 times that expected value.

Advantageously, the expected grain area of a representative sample of the tin oxide coating crystals measured in units of $10^{-4}$ $\mu m^2$ is numerically equal to a value of at least 0.5 times the layer thickness measured in nanometers. In some preferred embodiments, it is at least 0.6 times such thickness. We have found that coated glass whose coating crystal population has this property affords a visual appearance which is of even further reduced contrast, especially in the case of coatings having a thickness of at least 300 nm.

It is an important advantage of the present invention that it enables coatings of a high apparent uniformity to be formed notwithstanding a substantial thickness of the coating. Hitherto, the greater is the coating thickness, the greater has been the difficulty of avoiding apparent contrasts in the appearance of a coating. In preferred embodiments of the invention, the tin oxide layer has a thickness of at least 300 nm, and more preferably the layer is at least 700 nm in thickness. Coating layers having a thickness of 300 nm or more, and particularly coatings which are at least 700 nm in thickness tend to be more mechanically and chemically resistant, and if conductive, they are easier to make with a lower resistivity, expressed in Ohms per square, which enhances their value as electrically conductive coatings and their ability to reduce the emissivity of the coated surface in respect of infra-red radiation.

When the tin oxide coating layer has a thickness of at least 700 nm, as is usually the case with, for example, coatings having the lowest emissivity, for example a thickness of between 700 nm and 1200 nm, we have found that the benefits afforded by the present invention in terms of a low contrast in visual appearance are greatest when the expected grain area of a representative sample of the tin oxide coating crystals lies between $350 \times 10^{-4}$ $\mu m^2$ and $700 \times 10^{-4}$ $\mu m^2$ inclusive. The adoption of this feature is accordingly preferred.

BRIEF DESCRIPTION OF THE DRAWING

This invention will now be described in greater detail with reference to the accompanying diagrammatic drawings of various preferred embodiments of apparatus and by way of Examples of specific processes suitable for the manufacture of coated glass according to the invention.

In the drawings, each of FIGS. 1, 2, 4 and 5 is a cross-sectional side view of an embodiment of coating apparatus.

DESCRIPTION OF THE PREFERRED EMBODIMENTS

FIG. 1

Figure 1:
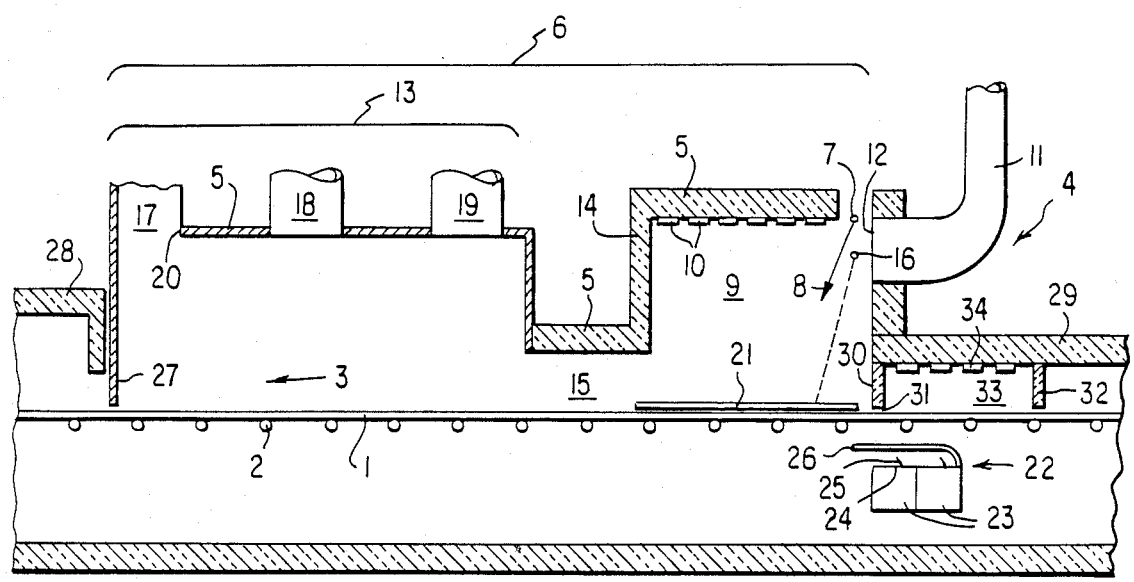

In FIG. 1, apparatus for pyrolytically forming a metal compound coating on an upper face of a hot glass substrate 1 in sheet or ribbon form comprises conveyor means such as rollers 2 for conveying the substrate in a downstream direction 3 along a path also indicated by reference numeral 1. The path 1 leads through a coating station 4 comprising a roof structure 5 defining a coating chamber 6 opening downwardly onto the substrate path 1 and a spray nozzle diagrammatically represented at 7 for spraying a stream of coating precursor solution into the chamber 6, in a direction 8 downwardly towards the substrate 1.

The spray nozzle 7 is located to spray the stream of coating precursor solution into a spraying zone 9 of the coating chamber 6 from a height of at least 75 cm above the substrate path 1. In the embodiment illustrated, the spray nozzle 7 is located to spray coating precursor material from at least 1 meter, and preferably at least 1.2 meters, above the substrate path 1, and it is of a type well known per se. The nozzle is arranged to spray the coating precursor solution in the direction 8 leading downwardly towards the substrate 1, and in the downstream direction 3, and it is movable to and fro along a track (not shown) across the width of the substrate path.

Heating means is provided for supplying heat to the spraying zone. In the embodiment illustrated, such heating means comprises downwardly directed radiant heaters 10 provided in the roof of the spraying zone 9. As additional heating means, ducting 11 is provided for discharging a stream of preheated gas into the spraying zone 9 in a direction to intersect the sprayed stream of coating precursor material. The ducting 11 has its discharge orifice 12 located in the upper half of the height between the spray nozzle 7 and the substrate 1, and is arranged to discharge that gas stream from upstream of the coating precursor spray discharge axis 8. The orifice 12 extends horizontally over the full width of the substrate path 1, and vertically over the upper third of the height of the spray nozzle 7 above the glass substrate. Gas discharged from orifice 12 is initially directed substantially horizontally, across the transverse path of the droplet stream 7, to maintain a circulation of gas within the spraying zone 9.

The discharged gas is suitably preheated, for example to a mean temperature in the range 300° C. to 500° C. The heaters 10 promote evaporation of solvent from the sprayed droplets during their travel towards the substrate 1 which can then be entrained in the hot discharged gas.

In an optional variant embodiment, the ducting 11 is divided into two ducts terminating in equal sized upper and lower orifices occupying the position of the orifice 12 so that currents of gas at different temperatures, for example 300° C. and 500° C. can be discharged at different levels there.

The roof structure 5 defines a passageway portion 13 of the coating chamber 6 leading downstream from the spraying zone 9 and imparting to the coating chamber 6 a total length of at least 2 meters, and preferably a length of at least 5 meters. In the embodiment illustrated, the roof structure 5 includes a bridge wall 14 over the substrate path which descends substantially vertically to define an exit slot 15 at the downstream end of the spraying zone separating that zone from the passageway, and the passageway 13 has a height substantially equal to that of the spraying zone 9. The height of the exit slot 15 is less than half of the height between the spray nozzle 7 and the substrate 1.

Upstream of the discharge axis 8 of the precursor spray nozzle 7, a gas jet nozzle diagrammatically represented at 16 is provided for discharging a jet of gas downwardly in the vicinity of the coating precursor stream thereby to shield the sprayed coating precursor material. The gas jet nozzle 16 is ganged to the coating spray nozzle 7 for repeated displacement therewith along the transverse track. A principal effect of this shielding jet of gas is to prevent the entrainment of coating reaction products and other pollutants in the rear of the stream of coating precursor material as it travels towards the substrate 1.

Exhaust ducting 17, 18, 19 is located along the passageway 13, and the exhaust ducting 17 at the downstream end of the coating chamber has an inlet 20 located over the substrate path 1 and extending across at least the major part of its width.

Baffles such as 21, projecting inwardly from the side walls of the coating chamber 6 are provided for inhibiting flow of atmospheric material past the sides of the substrate path 1 and between zones vertically above and vertically below that path over the length of the spraying zone 9, where the atmosphere will be richest in coating precursor material. Those baffles may be mounted on pivots on the side walls of the coating chamber 6 and be supported e.g. by threaded struts so that their position is adjustable for minimum clearance with the margin of the substrate 1.

Means 22 is provided for discharging gas into the environment of the substrate 1 so as to form a continuous current flowing in the downstream direction 3 beneath each margin of the substrate path 1 and along at least part of the path length occupied by the coating chamber 6.

The below ribbon gas discharge means comprises four plenum chambers 23 located two-by-two and extending across substantially the full width of the coating station 4. In the top of each plenum chamber 23 is formed a slot 24 bordered by a deflector lip 25 so that gas injected through the slots 24 is directed in the downstream direction 3 along the coating station 4. The slots 24 extend the full length of each plenum chamber 23 across the coating station 4. If desired such slots could be replaced by a plurality of spaced orifices. As shown in FIG. 1, a deflector plate 26 is located above the plenum chambers 23 so that the injected gas is not discharged directly against the substrate 1. The plenum chambers 23 may be fed with preheated gas from both sides of the coating station 4, for example from heat exchangers. Air may be used as the discharged gas and this may readily be heated by heat exchange with furnace flue gases. Such gas is preferably preheated to within 50° C. of the temperature of the substrate as the latter enters the coating chamber 6.

Gas discharged beneath the substrate 1 may be removed from the environment of the substrate 1 through optional exhaust ducting (not shown) having one or more inlets extending transversely under the substrate path for example located in register with the above path exhaust inlet 20.

A barrier wall 27 is provided above the substrate path 1 and extending across the full width of and substantially closing the downstream end of the coating chamber 6, so as substantially to prevent the flow of atmospheric material into or out of the coating chamber 6 at the downstream end of the passageway 13.

The coating station 4 is located between the exit from a ribbon forming plant (not shown), for example a float tank, and the entrance to an annealing lehr 28.

A passage from the ribbon forming plant to the coating chamber 6 has a roof 29, and the upstream end of the coating chamber is determined by a screening wall 30 depending from the passage roof 29 allowing small clearance for the substrate 1 to pass into the coating chamber via an entry slot 31.

The effect of this screening wall 30 is to limit the flow of atmospheric material into the coating chamber 6 from the upstream direction, so that atmospheric conditions within that region can more easily be controlled.

Upstream of the screening wall 30, between that wall and a second screening wall 32, there is an antechamber 33 in which heaters 34 are provided to preheat any gas drawn into the coating chamber 6 between the screening wall 11 and the ribbon 1.

Figure 2:
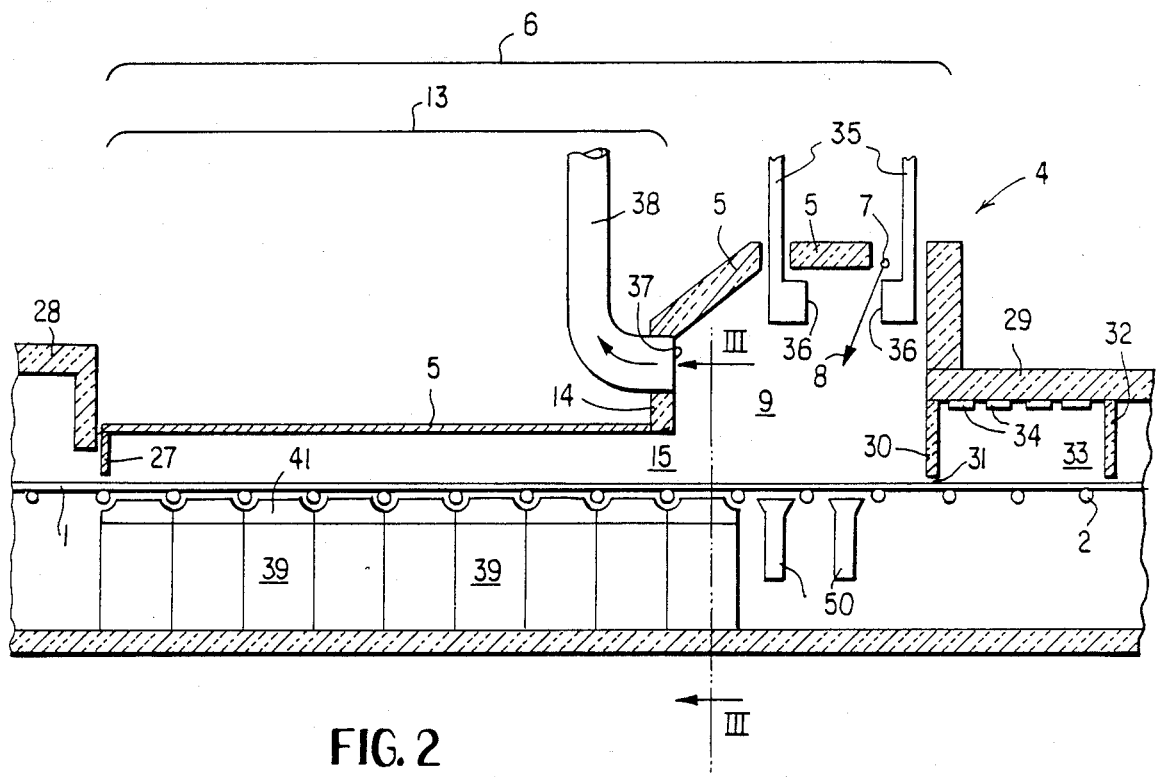
Figure 3:
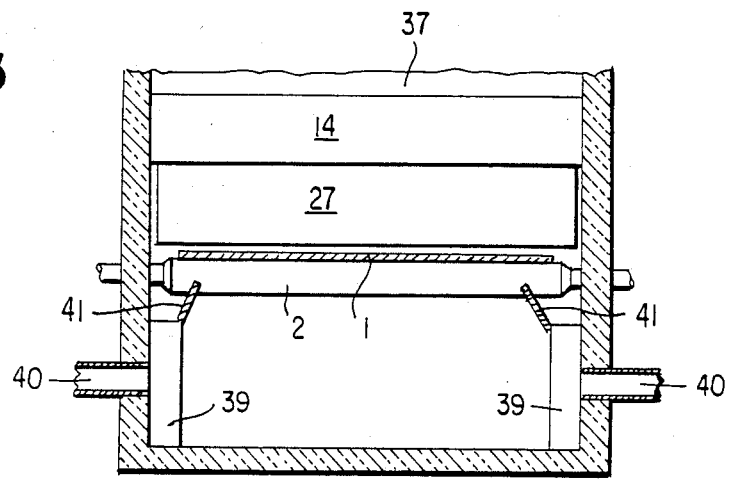
FIG. 3 is a section along the line III—III of FIG. 2.

FIGS. 2 and 3

In FIGS. 2 and 3, integers serving analogous functions to those illustrated in FIG. 1 have been allotted corresponding reference numerals.

In the spraying zone 9 at the upstream end of the coating chamber 6, gas discharge ducting 11 is absent, but is replaced by a pair of ducts 35 having discharge orifices 36 which are directed towards one another for the discharge of preheated gas from opposite sides of the axis 8 of the sprayed stream of coating precursor material. No other heating means for the coating chamber is shown above the level of the ribbon 1. The discharge orifices 36 extend across almost the full width of the coating chamber 6, and they are confined to the upper third of the height of the spray nozzle 7 above the substrate. In a variant, the discharge orifices 36 have a lesser width and they are moved to and fro across the spraying zone in tandem with the spray nozzle 7.

At the downstream side of the spraying zone 9, the roof structure 5 is inclined downwardly and then forms a vertical bridge wall 14 in which is located a full width inlet 37 for exhaust ducting 38 for the aspiration of vapours from the spraying zone to prevent the formation of any stagnant zone therein.

Downstream of the exit slot 15 beneath the bridge wall 14, the roof structure 5 continues to define a passageway portion 13 of the coating chamber 6 which has the same height as that exit slot.

Along the length of that passageway 13, exhaust means is provided at each side of the coating chamber beneath the level of the substrate path 1. This exhaust means comprises a plurality of open-topped exhaust boxes 39 communicating with side exhaust ducts 40. From FIG. 2 it will be noted that these exhaust boxes 39 extend over the full length of the substrate path occupied by the passageway 13, and that the upstream exhaust box is in fact located beneath the spraying zone 9. Projecting upwardly and inwardly from the exhaust boxes are provided baffles 41 which extend beneath the margins of the substrate path and upwardly between the conveyor rollers 2. This arrangement provides an effective separation of the atmospheres vertically above and vertically below the substrate path along the passageway.

In order to inhibit coating precursor and other atmospheric material from flowing down past the sides of the substrate path over a more upstream region of the spraying zone 9, blowers 50 for discharging preheated air are provided to maintain an upward flow of relatively clean gas against the side walls of the coating chamber there. This also gives some degree of protection to those walls from corrosion due to the atmosphere within the chamber.

FIG. 4

As before, integers serving analogous functions to those shown in the previous Figures have been allotted corresponding reference numerals.

Figure 4:
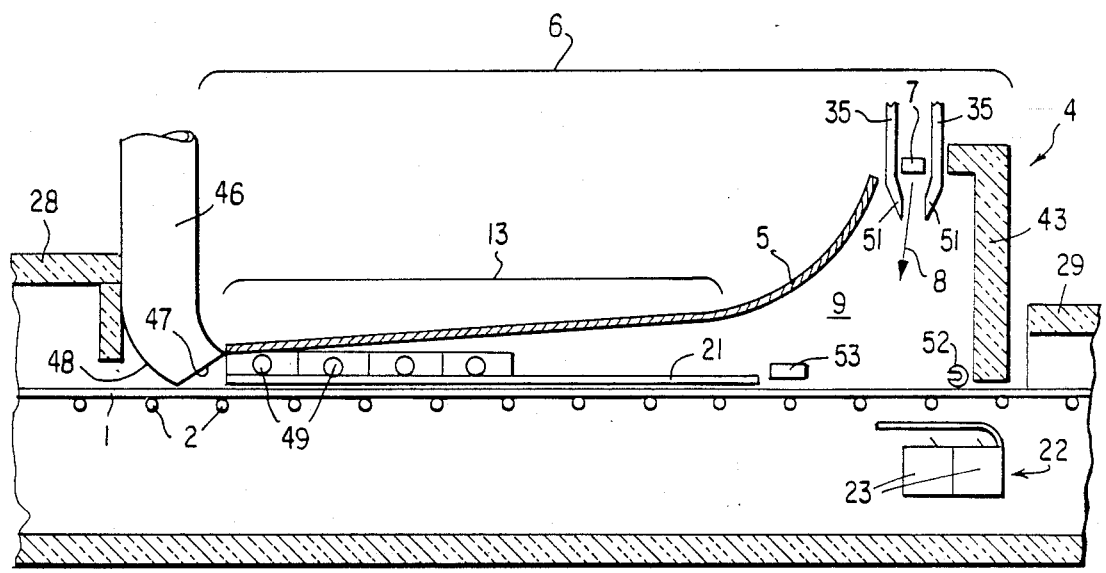

In the embodiment of FIG. 4, the single reciprocating spray nozzle 7 of the previous Figures is replaced by a plurality of such nozzles, though only one is shown. These nozzles 7 reciprocate along portions of a track (not shown) running between a pair of gas discharge ducts 35 having downwardly inclined discharge orifices 51 extending over the full width of the coating chamber.

The roof structure 5 descends in a continuous partly curved profile above the spraying zone 9, and it continues to descend so that the passageway 13 is of decreasing height in the downstream direction, and facilitating a smooth general downstream flow of material within the coating chamber 6.

At the downstream end of the passageway 13, atmospheric material is aspirated into exhaust ducting 46 having an inlet 47 defined in part by a curved exhaust scoop 48 which extends above the path of the substrate 1 across the full width of the passageway, and substantially closes its downstream end. Such scoop 48 may optionally be mounted pivotally so that it can be adjusted for minimum clearance with the substrate 1. Also in the downstream end half of the passageway 13, atmospheric material is aspirated into exhaust ducting 49 located to each side of the coating chamber, in order to encourage a lateral spread of the atmospheric material flowing along the coating chamber. Such material is also inhibited from flowing beneath the substrate by baffles such as 21 projecting from the side walls of the coating chamber over the substrate margins along substantially the whole length of the passageway and extending well into the spraying zone, almost up to its upstream end.

The descent of the roof 5 of the passageway compensates for the reduced quantity of material flowing along the passageway due to this increased aspiration.

At the upstream end of the coating chamber, end wall 43 descends close to the path of the substrate 1, substantially closing that end of the chamber, and just downstream of that end wall, there is provided an auxiliary gas discharge conduit 52 for discharging preheated gas into the chamber adjacent the substrate to flow in the downstream direction, to condition the atmosphere in contact with the substrate where it is first contacted by the coating precursor material, and to inhibit the accumulation of vapour against the upstream end wall 43.

At the downstream end of the spraying zone, two horizontally directed inwardly inclined gas jet discharge nozzles 53 are provided for entraining the coating precursor vapour which will be generated within the spraying zone inwardly away from the side walls of the passageway and in the downstream direction.

FIG. 5

Figure 5:
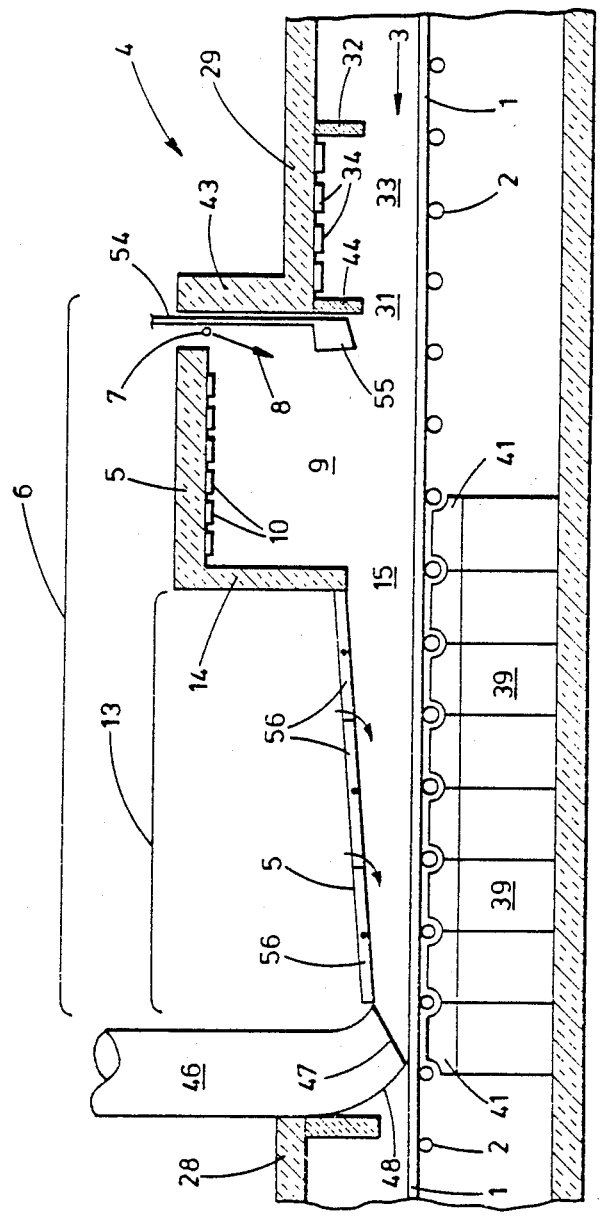

In FIG. 5, integers serving analogous functions to those shown in the preceding Figures have again been allotted corresponding reference numerals.

The spraying zone 9 is of similar shape to that shown in FIG. 1. Beneath the upstream end wall 43 of the coating chamber, the screening wall 30 shown in FIGS. 1 and 2 is replaced by a bridge wall 44 allowing a rather taller entry slot 31 so that atmospheric material can be drawn along in contact with the glass and into the coating chamber from the antechamber 33 more easily. If desired that bridge wall 44 can be adjustable in height for varying the opening of the entry slot 31. Additional gas discharge ducting (not shown) may be provided for discharging preheated gas downwardly into the antechamber for control of the layer of atmospheric material immediately above the substrate 1 up to at least the zone where the coating material impinges against the glass.

As in FIG. 4, the passageway 13 decreases in height away from the exit slot.

In the spraying zone 9 at the upstream end of the coating chamber 6, gas discharge ducting 35 is absent, but is replaced by ducting 54 having a discharge orifice 55 which is directed towards the upstream side of the sprayed stream of coating precursor material. In some embodiments, the discharge orifice 55 has a lesser width than the coating chamber 6, and it is moved to and fro across the spraying zone in tandem with the spray nozzle 7. In other embodiments, the discharge orifice 55 extends across almost the full width of the coating chamber 6.

Downstream of the exit slot 15 beneath the bridge wall 14, the roof structure 5 continues, to define a passageway portion 13 of the coating chamber 6 which descends in the downstream direction. In this embodiment however, the roof structure over the passageway 13 is formed by a plurality of louvres 56 which are pivotally openable so that preheated air can be caused to flow into the passageway and along its roof to augment the temperature there and to inhibit coating deposition or condensation on that roof.

Along the length of that passageway 13, exhaust means is provided at each side of the coating chamber beneath the level of the substrate path 1, as described with reference to FIGS. 2 and 3.

EXAMPLE 1

In a specific practical embodiment of the apparatus shown in FIG. 1, the coating chamber 6 is a little over 3 meters wide to accommodate glass ribbons having a width of up to about 3 meters. The roof structure 5 above the spraying zone 9 of the coating chamber is just over 1.5 meters above the level of the ribbon path 1, and the spraying orifice of the droplet discharge nozzle 7 is close to the level of that roof. That nozzle 7 is arranged to discharge a conical stream of droplets with a half cone angle of 10° with its axis 8 at an angle of 47° to the horizontal: the gas jet nozzle 16 has its outlet 25 cm below and 7 cm downstream of the spray nozzle 7 and is arranged with its axis at 60° to the horizontal. The gas discharge orifice 12 is 50 cm high with its top level with the nozzle 7. The bridge wall 14 at the downstream end of the spraying zone 9 is separated from the gas circuit discharge orifice 12 by a distance of 2.8 meters. The passageway 13 has the same height as the spraying zone 9, and the exit slot 15 has a height of 50 cm above the level of the ribbon path 1. The length of that passageway is 4 meters.

This apparatus is particularly designed for the deposition of tin oxide coatings starting from a solution of stannous chloride as coating precursor material.

Using such apparatus, a tin oxide coating 750 nm in thickness was formed on a 6 mm thick ribbon of glass travelling at a speed of 8.5 m/min. The glass entered the coating chamber at a temperature of 600° C., and the coating precursor used was an aqueous solution of stannous chloride containing ammonium bifluoride for the provision of doping ions in the coating. This solution was sprayed from the nozzle at a rate of 220 L/h while the nozzle was reciprocated across the ribbon path at 22 cycles per minute.

The antechamber 33 was substantially closed, and the atmosphere therein was heated by electrical resistance heaters.

Radiant heaters in the roof of the spraying zone were switched on and gas was discharged through the orifice 12 at a rate of 7000 Nm$^3$/min and a temperature of 400° C. Gas was discharged from the below ribbon plenum boxes 23 at a temperature of 600° C.

In operation it was found that by the time the stream of sprayed coating precursor material reached the level of the ribbon a substantial proportion of the solvent had evaporated from the stream, leaving very small droplets of liquid stannous chloride and stannous chloride vapour to contact the glass to initiate coating formation. The spraying zone 9 above the ribbon was filled with a circulating atmosphere laden with stannous chloride vapour, and this was drawn through the exit slot 15 and into the passageway 13 by aspirating forces generated in exhaust ducting 17, 18, 19. It was found that the atmosphere within the coating chamber 6 was substantially clear, except in the vicinity of the droplet stream, indicating that substantially all the stannous chloride and solvent outside that stream was in vapour phase, so that over the greater part of the length of the coating chamber 6 in which the glass was exposed to coating precursor material, the atmosphere in that chamber 1 was substantially free from material in the liquid phase. Of course the passageway 13 also contained coating reaction products. The forces generated and the geometry of that passageway were such that atmospheric material leaving the exit slot 15 slowed down and the rather dense stannous chloride vapours tended to form a layer in contact with the coating being formed to allow conditioning of that coating, while the less dense solvent vapour and coating reaction products tended to flow more directly towards the exhaust ducting. As a result of all this, the coating formed had a crystal structure at the glass/coating interface which promoted a high quality coating structure and hence good and uniform optical qualities, and the inclusion of coating reaction products which would lead to defects tended to be avoided.

Especially noteworthy was the very low haze, and very uniform haze exhibited by the coated glass.

The resulting coating was photographed at a magnification of 100,000 times using an electron microscope and the resulting photographs were processed to assess the areas occupied thereon by a representative sample of the tin oxide coating crystals. After analysis, the following were noted:

| | |
|---|---|
| Coating thickness | 750 nm |
| Expected grain area | $492 \times 10^{-4} \mu m^2$ |
| Standard deviation | $481 \times 10^{-4} \mu m^2$ |
| Coefficient of skewness | 3.9 |

This Example also makes use of the invention described in our copending British Patent Application filed on Dec. 20, 1985, under Application No. 85 31 423.

EXAMPLE 2

The apparatus of FIG. 2 was used to form a coating of the same thickness as in Example 1 using the same precursor material and on a ribbon of glass of the same thickness and moving at the same speed. The spray nozzle 7 was also controlled as in Example 1. The coating chamber 6 had a total length of 7.5 meters.

The glass entered the coating chamber 6 at a temperature of 600° C., and air preheated to 500° C. was discharged at a rate of 3600 Nm$^3$/h from each of the discharge orifices 36. As a result, a major proportion of the sprayed material was evaporated during its trajectory towards the ribbon, while a residual stream continued and impacted positively against the glass.

The below path level aspiration of atmospheric material along the passageway tends to hold down a layer of precursor vapour laden atmosphere in contact with the ribbon to promote finishing of the coating. The aspiration was performed at a total rate of about 70,000 m$^3$/h at a mean temperature of about 350° C.

This also gave excellent results in terms of the uniformly high quality of the coating formed, especially in regard to its low and uniformly low haze factor.

The resulting coating was photographed at a magnification of 100,000 times using an electron microscope and the resulting photographs were processed to assess the areas occupied thereon by a representative sample of the tin oxide coating crystals. After analysis, the following were noted:

| | |
|---|---|
| Coating thickness | 750 nm |
| Expected grain area | $559 \times 10^{-4} \mu m^2$ |

| | |
|---|---|
| Standard deviation | 473 × 10⁻⁴ μm² |
| Coefficient of skewness | 1.3 |

This Example also makes use of the invention described in our copending British Patent Application filed on Dec. 20, 1985, under Application No. 85 31 423.

EXAMPLE 3

The apparatus of FIG. 4 was used to form a 400 nm thick fluorine doped tin oxide coating on a 4 mm thick ribbon of glass travelling from a float chamber at a speed of 8.5 m/min to enter the coating station at a temperature of 600° C. The coating chamber had a total length of 8 meters.

The coating precursor used was an aqueous solution of stannous chloride containing ammonium bifluoride for the provision of doping ions in the coating. This solution was sprayed from the nozzles at a rate of 110 L/h. The nozzles were all parallel and were inclined to the horizontal by 75°. They were located 1.5 m above the substrate.

Air preheated to 550° C. was discharged at a rate of 5000 Nm³/h from the two discharge orifices 51 to entrain evaporated precursor solution, and the air discharged from the auxiliary gas discharge conduit 52 was also preheated to 500° C. Aspiration above the level of the substrate was controlled to balance the quantity of gas introduced into or formed within the coating chamber and to promote a general downstream flow of material.

Air preheated to 600° C. was discharged at a rate of 3000 Nm³/h from the below substrate path discharge means 22.

This process also resulted in the formation of a high quality coating, substantially free from local defects and with a very low, and uniformly low, haze factor.

The resulting coating was photographed at a magnification of 100,000 times using an electron microscope and the resulting photographs were processed to assess the areas occupied thereon by a representative sample of the tin oxide coating crystals. After analysis, the following were noted:

| | |
|---|---|
| Coating thickness | 400 nm |
| Expected grain area | 270 × 10⁻⁴ μm² |
| Standard deviation | 175 × 10⁻⁴ μm² |
| Coefficient of skewness | 1.3 |

This Example also makes use of the invention described in our copending British Patent Application filed on Dec. 20, 1985, under Application No. 85 31 423.

EXAMPLE 4

The apparatus of FIG. 5 was used to form a doped tin oxide coating 750 nm thick on a 3 m wide ribbon of 6 mm float glass travelling at 8.5 m/min, and entering the coating chamber with a temperature of 600° C. The coating chamber had a total length of 8 meters. An aqueous solution of stannous chloride containing ammonium bifluoride was discharged at a rate of about 220 L/h at a pressure of 25 bar from a height of 1.8 m above the glass using a spray nozzle inclined in the downstream direction at an angle of 50° to the horizontal and which was reciprocated across the ribbon path at a rate of 23 cycles per minute.

The total amount of atmospheric material aspirated through the exhaust ducting 40 (compare FIG. 3) and 46 was about 100,000 m³/h at a temperature of about 300° to 350° C.

Radiant roof heaters 10 helped to ensure evaporation of the great majority of the coating precursor material and solvent before contact with the glass. Preheated air was drawn into the coating chamber 6 from the upstream antechamber 33 to contribute to the atmospheric material aspirated.

The discharge orifice 55 extended the full width of the coating chamber, and it was used for the discharge of air heated to 600° C. at a rate of 25,000 m³/h.

As a result, the coating formed had a high quality structure and uniform thickness over the full width of the ribbon and hence good and uniform optical qualities. The inclusion of coating reaction products which would lead to defects was substantially avoided.

Preheated air was drawn into the coating chamber 6 from the antechamber 33 through the entry slot 31.

The resulting coating was photographed at a magnification of 100,000 times using an electron microscope and the resulting photographs were processed to assess the areas occupied thereon by a representative sample of the tin oxide coating crystals. After analysis, the following were noted:

| | |
|---|---|
| Coating thickness | 750 nm |
| Expected grain area | 627 × 10⁻⁴ μm² |
| Standard deviation | 549 × 10⁻⁴ μm² |
| Coefficient of skewness | 1.3 |

This Example also makes use of the invention described in our copending British Patent Application filed on Dec. 20, 1985, under Application No. 85 31 424, and of the invention described in our copending British Patent Application filed on Dec. 20, 1985, Application No. 85 31 425.

In a variant, preheated air was blown positively into the antechamber 33.

In another variant of this Example, the glass was at 620° C. Hot air was blown into the spraying zone 9 through a discharge orifice 55 which was ganged to the spray nozzle 7, at a temperature of 550° C. and at a rate of about 5000 m³/h. As a result, more of the sprayed coating precursor material in the spraying zone 9 was in the liquid phase. In this variant, the results of the statistical analysis were as follows:

| | |
|---|---|
| Coating thickness | 750 nm |
| Expected grain area | 400 × 10⁻⁴ μm² |
| Standard deviation | 471 × 10⁻⁴ μm² |
| Coefficient of skewness | 2.75 |

This increase in coefficient of skewness may be attributed to the coating forming from a mixture of coating precursor material in the liquid and in the vapour phase. The haze factor of this variant coating was lower than that of the coating of the first part of this Example.

Figure 6:
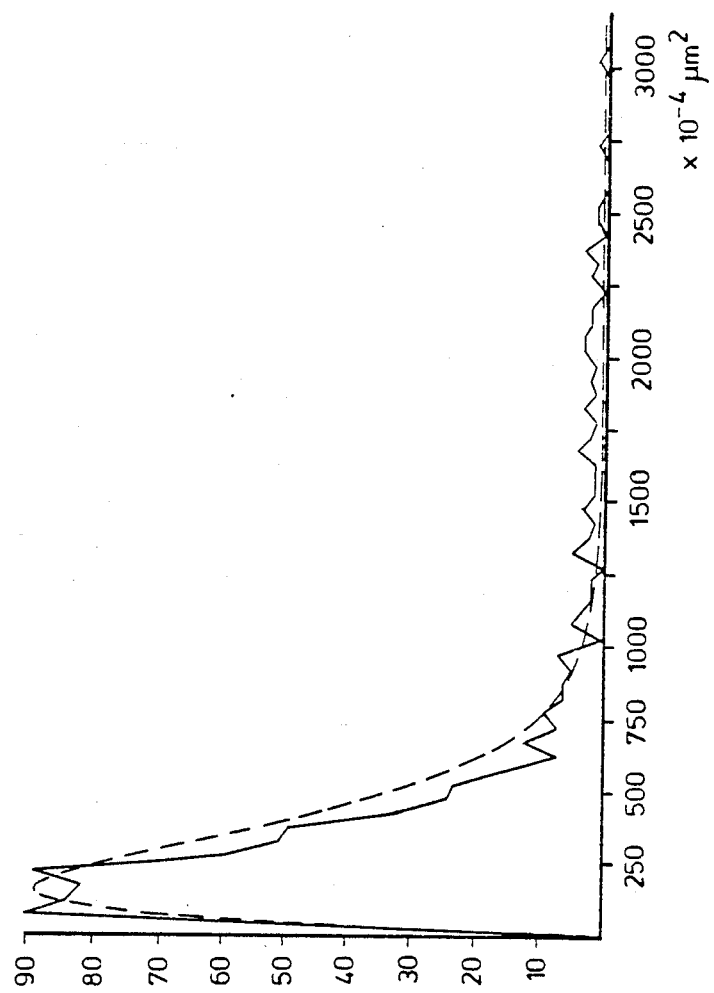
FIG. 6 is a population density graph in terms of crystal area.

The population distribution of the crystal grain areas as measured from electron-micrographs is shown as the graph of FIG. 6.

In FIG. 6, crystal area size intervals of 50 × 10⁻⁴ μm² are taken and the number of crystals falling within each interval is counted and plotted at the centre of each respective interval. The number of crystals in each interval is given along the ordinate, and the area in units of $10^{-4}$ $\mu m^2$ is given along the abscissa. The resulting plot is shown in solid line in FIG. 6. It will be noted that this is a gamma-type distribution, as shown by the close correspondence with the theoretical gamma distribution curve also shown (in broken line) in FIG. 6.

EXAMPLE 5

A modified apparatus based on that of FIG. 5 was used to form a tin oxide coating. The modifications to the apparatus comprised the following:

Spraying zone ducting 37, 38 as shown in FIG. 2 was added.

Side exhaust ducting 49 as shown in FIG. 4 was used instead of the below ribbon exhaust system 39, 41, and below substrate path gas discharge means 22 also as shown in that Figure was incorporated.

The coating was 750 nm thick doped with 0.2% antimony oxide on a 3 m wide ribbon of 6 mm float glass travelling at 8.5 m/min, and entering the coating chamber with a temperature of 600° C. The coating chamber had a total length of 8 meters. An aqueous solution of stannous chloride containing antimony chloride was discharged at a rate of about 230 L/h at a pressure of 25 bar from a height of 1.5 m above the glass using a spray nozzle inclined in the downstream direction at an angle of 47° to the horizontal which was reciprocated across the ribbon path.

Heaters 10 were controlled to evaporate the majority of the sprayed material within the upper half of the spraying zone 9, and because of the reciprocation of the spraying nozzle 7 and the current pattern caused thereby, this evaporated material became intimately mixed with the air within that part of the spraying zone.

The total amount of atmospheric material aspirated through the passageway exhaust ducting was about 60,000 m³/h at a temperature of about 350° C. Aspiration through the spraying zone ducting was maintained at the minimum level necessary to keep the atmosphere in the upper part of the downstream end of the spraying zone 9 clear.

Hot air was blown downwardly into the antechamber 33 through ducting (not shown) at a temperature of 620° C. (the same temperature as the ribbon there) and at a rate of about 7000 Nm³/h. The bridge wall 44 was adjusted so that the entry slot 31 had a uniform opening across the width of the ribbon.

Air preheated to 550° C. was discharged at a rate of 3000 Nm³/h from the below substrate path discharge means.

This process also resulted in the formation of a substantially defect free coating, in this case of a bluish aspect, having excellent optical properties and uniformity of thickness.

The resulting coating was photographed at a magnification of 100,000 times using an electron microscope and the resulting photographs were processed to assess the areas occupied thereon by a representative sample of the tin oxide coating crystals. After analysis, the following were noted:

| | |
|---|---|
| Coating thickness | 750 nm |
| Expected grain area | 407 × $10^{-4}$ $\mu m^2$ |
| Standard deviation | 492 × $10^{-4}$ $\mu m^2$ |
| Coefficient of skewness | 1.6 |

This Example also makes use of the invention described in our copending British Patent Application filed on Dec. 20, 1985, under Application No. 85 31 424.

EXAMPLE 6

A 400 nm thick fluorine doped tin oxide coating was formed on a 5 mm thick ribbon of glass travelling from a float chamber at a speed of 8.5 m/min to enter the coating station at a temperature of 580° C. using apparatus similar to that illustrated in FIG. 4. In this Example, the below ribbon gas discharge means 22 was not used, nor was the auxiliary gas discharge conduit 52. The coating chamber had a total length of 8 meters. A single reciprocating spray nozzle was used.

The coating precursor material used was an aqueous solution of stannous chloride containing ammonium bifluoride for the provision of doping ions in the coating. This solution was sprayed at a rate of 110 L/h under a pressure of 23 bar while the nozzle was reciprocated at a rate of 22 cycles per minute. The nozzle was disposed as in Example 3.

Preheated air was discharged from the discharge orifices 51. Aspiration above the level of the substrate was maintained at a rate of 80,000 m³/h to maintain a general downstream flow of material within the coating chamber.

This process also resulted in the formation of a highly uniform coating, substantially free from local defects.

The resulting coating was photographed at a magnification of 100,000 times using an electron microscope and the resulting photographs were processed to assess the areas occupied thereon by a representative sample of the tin oxide coating crystals. Afer analysis, the following were noted:

| | |
|---|---|
| Coating thickness | 400 nm |
| Expected grain area | 247 × $10^{-4}$ $\mu m^2$ |
| Standard deviation | 125 × $10^{-4}$ $\mu m^2$ |
| Coefficient of skewness | 0.8 |

This Example also makes use of the invention described in our copending British Patent Application filed on Dec. 20, 1985, under Application No. 85 31 424.

The relatively low standard deviation of this Example, only just over half the expected grain area, is attributable to the slightly lower temperature at which the coating operation is performed.

EXAMPLE 7

Using apparatus based on that shown in FIG. 5, a tin oxide coating 750 nm in thickness was formed on a 6 mm thick ribbon of float glass travelling at a speed of 8.5 m/min.

In the apparatus used, the coating chamber 6 is a little over 3 meters wide to accommodate glass ribbons having a width of up to about 3 meters. The roof structure 5 above the spraying zone 9 of the coating chamber is just over 1 meter above the level of the ribbon path 1, and the spraying orifice of the droplet discharge nozzle 7 is close to the level of that roof. That nozzle 7 is arranged to discharge a conical stream of droplets in a direction 8 at an angle of 45° to the horizontal. The bridge wall 14 at the downstream end of the spraying zone 9 is separated from the coating chamber upstream end wall by a distance of 2.2 meters. The passageway 13 has a height which reduces from 40 cm at the exit slot 15 to 25 cm at its downstream end. The length of that passageway is 4.5 meters.

The glass entered the coating chamber at a temperature of 600° C., and the coating precursor used was an aqueous solution of stannous chloride containing ammonium bifluoride for the provision of doping ions in the coating. This solution was sprayed from the nozzle at a rate of 220 L/h while the nozzle was reciprocated across the ribbon path.

Radiant heaters in the roof of the spraying zone were switched on and air was discharged through the orifice 55 at a rate of 6000 Nm³/min and a temperature of 400° C. As a result, part of the sprayed stream of coating precursor material was evaporated leaving part only to continue for positive impact against the glass. The thus formed coating precursor vapour was entrained in the stream of preheated air discharged from the orifice 55, to flow through the exit slot 15 and along the passageway 13 to the exhaust ducting 46.

Aspirating forces were generated in the exhaust ducting to remove about 100,000 m³/h of atmospheric material from the coating chamber at a mean temperature of about 350° C., thus drawing in a blanket layer of gas preheated by heater 34 and covering the substrate.

It was found that this gave an exceptionally fine control of the atmosphere immediately above the substrate in the region where the coating started to form. This was found to be particularly beneficial in giving a regular coating of the required thickness and in that it increased the width of the ribbon over which the coating was formed to that required thickness.

In the result, the coating formed had a high quality crystal structure and hence good and uniform optical qualities, and the inclusion of coating reaction products which would lead to defects tended to be avoided.

The resulting coating was photographed at a magnification of 100,000 times using an electron microscope and the resulting photographs were processed to assess the areas occupied thereon by a representative sample of the tin oxide coating crystals. After analysis, the following were noted:

| Coating thickness | 750 nm |
|---|---|
| Expected grain area | $520 \times 10^{-4} \mu m^2$ |
| Standard deviation | $444 \times 10^{-4} \mu m^2$ |
| Coefficient of skewness | 1.4 |

This Example also makes use of the invention described in our copending British Patent Application filed on Dec. 20, 1985, under Application No. 85 31 423, and of the invention described in our copending British Patent Application filed on Dec. 20, 1985, Application No. 85 31 425.

EXAMPLE 8

Apparatus based on that shown in FIG. 5 was used to form a tin oxide coating of the same thickness as in Example 7 on a ribbon of glass of the same thickness and moving at the same speed. The coating precursor material used was stannic chloride dissolved in dimethylformamide, and this was discharged from a spray nozzle 7 located 75 cm above the ribbon and inclined to the horizontal by 30°. Stannic chloride vapour was discharged from a slot (not shown) extending over almost the full width of the upstream end wall 43 between the levels of the spray nozzle 7 and the gas discharge orifice 55. The vapours formed in the spraying zone 9 were aspirated along the passageway 13 by frontal aspiration through the exhaust ducting 46 only, and at a rate to give a coating of the desired thickness.

The glass entered the coating chamber 6 at a temperature of 600° C., and air preheated to 600° C. was discharged at a rate of 3000 Nm³/h into the antechamber 33 from ducting which is not shown, to flow into the coating chamber as a blanket layer covering the glass.

Atmospheric material within the spraying zone 9 became intimately mixed and a continuous flow of vapour laden atmosphere was drawn along the passageway 13 in contact with the face of the substrate on which the coating was being formed.

Air preheated to 550° C. was discharged at a rate of 3000 Nm³/h from below substrate path discharge means (compare FIG. 4).

This also gave excellent results in terms of the uniformly high quality coating formed.

The resulting coating was photographed at a magnification of 100,000 times using an electron microscope and the resulting photographs were processed to assess the areas occupied thereon by a representative sample of the tin oxide coating crystals. After analysis, the following were noted:

| Coating thickness | 750 nm |
|---|---|
| Expected grain area | $474 \times 10^{-4} \mu m^2$ |
| Standard deviation | $467 \times 10^{-4} \mu m^2$ |
| Coefficient of skewness | 1.3 |

This Example also makes use of the invention described in our copending British Patent Application flied on Dec. 20, 1985, under Application No. 85 31 425.

EXAMPLE 9

Apparatus based on that shown in FIGS. 2 and 3 was used to form a 400 nm coating of fluorine doped tin oxide on a ribbon of 5 mm float glass travelling at 8.5 m/min to enter the coating chamber at a temperature of 600° C.

Further below ribbon blowers such as those shown at 50 were provided beneath the antechamber 33, and the screening wall 30 was constituted as a gate for adjusting opening of the entry slot 31. Gas inlet and exhaust ducting 35 to 38 were removed from the spraying zone 9, and radiant heaters such as 10 (FIG. 1) were provided above that zone.

The coating precursor used was a solution of tin chloride containing ammonium bifluoride for the provision of doping ions in the coating. This solution was sprayed from the nozzle at a rate of 120 L/h under a pressure of 23 bar while the nozzle was reciprocated at a rate of 23 cycles per minute.

Air preheated to 600° C. was discharged into the antechamber 33 from the further below ribbon blowers and then drawn into the coating chamber to form a blanket layer covering the glass. Aspiration through the exhaust system 39 to 41 was at a rate of 60,000 m³/h at about 350° C. to maintain a general downstream flow of material within the coating chamber.

The radiant roof heaters were switched on to evaporate the sprayed coating precursor material during its travel towards the substrate. Because of the turbulence caused by the reciprocating movement of the spray nozzle and the sprayed stream of coating precursor material, the evaporated material became intimately mixed with air in the spraying zone 9, and this vapour laden atmosphere was drawn down into the exit slot 15 and along the passageway 13. The coating precursor vapour mixed with the blanket layer of atmosphere in contact with the glass, and a coating of the required thickness was deposited.

The antechamber 33 included heaters 34 for preheating the atmosphere therein. These heaters permit the air to be heated according to any desired temperature profile, for example to a greater extent at the sides of the antechamber.

The coating formed by the process of this Example was of extremely high quality and uniform appearance over substantially the whole width of the ribbon.

The resulting coating was photographed at a magnification of 100,000 times using an electron microscope and the resulting photographs were processed to assess the areas occupied thereon by a representative sample of the tin oxide coating crystals. After analysis, the following were noted:

| Coating thickness | 400 nm |
| Expected grain area | $247 \times 10^{-4} \mu m^2$ |
| Standard deviation | $125 \times 10^{-4} \mu m^2$ |
| Coefficient of skewness | 0.8 |

This Example also makes use of the invention described in our copending British Patent Application filed on Dec. 20, 1985, under Application No. 85 31 424, and of the invention described in our copending British Patent Application filed on Dec. 20, 1985, Application No. 85 31 425.

EXAMPLE 10

Apparatus based on that shown in FIG. 5 was used to form a tin oxide coating 257 nm in thickness. That apparatus was modified by the exclusion of the antechamber 33. The length of the coating chamber 6 was about 6 meters.

The glass ribbon entered the coating chamber at a temperature of 600° C. with a speed of 10 m/min.

The coating precursor used was a solution of stannous chloride containing ammonium bifluoride for the provision of doping ions in the coating. This solution was sprayed from the nozzle at a rate of 70 L/h under a pressure of 20 bar while the nozzle was reciprocated at a rate of 22 cycles per minute. The nozzle was located 1 meter above the level of the glass and was angled downwardly at 45°.

Air preheated to 600° C. was discharged into the spraying zone through discharge orifice 55. The rate of such discharge and the rate at which atmospheric material was aspirated from the coating chamber were adjusted to achieve a coating of the required thickness.

The coating formed by the process of this Example was also of extremely high quality and uniform appearance.

| The following properties were noted: | |
| Coating thickness | 257 nm |
| Expected grain area | $127 \times 10^{-4} \mu m^2$ |
| Standard deviation | $73 \times 10^{-4} \mu m^2$ |
| Coefficient of skewness | 1.3 |

This Example also makes use of the invention described in our copending British Patent Application filed on Dec. 20, 1985, under Application No. 85 31 424.

EXAMPLES 11 to 19

In a variant of each of the foregoing Examples, the apparatus is used to form a coating onto glass which has been cut into sheets and then reheated, the process being otherwise similar.

Similar results in terms of coating quality are achieved.

What is claimed is:

1. Flat glass bearing a tin oxide coating layer comprising generally perpendicularly oriented crystals, characterised in that such tin oxide layer is at least 200 nm thick and in that the expected grain area of a representative sample of the tin oxide coating crystals measured in units of $10^{-4} \mu m^2$ is numerically equal to a value of at least 0.4 times the layer thickness measured in nanometers.

2. Flat glass according to claim 1, wherein when a population density curve is established by plotting the number of crystals of a representative sample of the tin oxide crystals having a grain area within a given interval on the ordinate, and grain area on the abscissa, that curve has a positive coefficient of skewness.

3. Flat glass according to claim 2, wherein the population density curve has a coefficient of skewness of at least 1.

4. Flat glass according to claim 2, wherein the standard deviation of the grain area of a representative sample of the tin oxide coating crystals is at least half the expected value.

5. Flat glass according to claim 4, wherein the standard deviation of the grain area of a representative sample of the tin oxide coating crystals is at least 0.7 times the expected value.

6. Flat glass according to claim 1, wherein the expected grain area of a representative sample of the tin oxide coating crystals measured in units of $10^{-4} \mu m^2$ is numerically equal to a value of at least 0.5 times the layer thickness measured in nanometers.

7. Flat glass according to claim 1, wherein the tin oxide layer has a thickness of at least 300 nm.

8. Flat glass according to claim 7, wherein the tin oxide layer has a thickness of at least 700 nm.

9. Flat glass according to claim 8, wherein the expected grain area of a representative sample of the tin oxide coating crystals lies between $350 \times 10^{-4} \mu m^2$ and $700 \times 10^{-4} \mu m^2$ inclusive.

10. Flat glass bearing a tin oxide coating layer comprising generally perpendicularly oriented crystals, characterized in that such tin oxide layer is at least 200 nm thick and in that the expected grain area of a representative sample of the tin oxide coating crystals measured in units of $10^{-4} \mu m^2$ is numerically equal to a value of at least 0.4 times the layer thickness measured in nanometers, wherein said tin oxide layer is formed on said flat glass by a layer deposited pyrolization process which includes the steps of: spraying a coating precursor material in the form of droplets into a chamber through which hot glass passes; evaporating at least a part of the precursor material before that material contacts the glass; and causing a current of gas loaded with precursor material vapor to flow along the glass and in contact therewith.

11. The flat glass according to claim 10, wherein evaporation of the coating precursor material takes place in the chamber and wherein the coating precursor material is substantially all vaporized before contacting the hot glass.

12. The flat glass according to claim 10, wherein evaporation of the coating precursor material takes place in the chamber and wherein the coating precursor material is completely vaporized before contacting the hot glass.

13. The flat glass according to claim 10, wherein when a population density curve is established by plotting the number of crystals of a representative sample of the tin oxide crystals having a grain area within a given interval on the ordinate, and grain area on the abscissa, that curve has a positive coefficient of skewness.

14. The flat glass according to claim 13, wherein the population density curve has a coefficient of skewness of at least 1.

15. The flat glass according to claim 13, wherein the standard deviation of the grain area of a representative sample of the tin oxide coating crystals is at least half the expected value.

16. The flat glass according to claim 15, wherein the standard deviation of the grain area of a representative sample of the tin oxide coating crystals is at least 0.7 times the expected value.

17. The flat glass according to claim 10, wherein the expected grain area of a representative sample of the tin oxide coating crystals measured in units of $10^{-4}$ $\mu m^2$ is numerically equal to a value of at least 0.5 times the layer thickness measured in nanometers.

18. The flat glass according to claim 10, wherein the tin oxide layer has a thickness of at least 300 nm.

19. The flat glass according to claim 18, wherein the tin oxide layer has a thickness of at least 700 nm.

20. The flat glass according to claim 19, wherein the expected grain area of a representative sample of the tin oxide coating crystals lies between $350 \times 10^{-4}$ $\mu m^2$ and $700 \times 10^{-4}$ $\mu m^2$ inclusive.

* * * * *